(12) United States Patent
Elahee (10) Patent No.: US 8,440,312 B2
(45) Date of Patent: May 14, 2013

(54) THERMAL INTERFACE MATERIALS AND METHODS FOR THEIR PREPARATION AND USE

(75) Inventor: G. M. Fazley Elahee, Midland, MI (US)

(73) Assignee: Dow Corning Corporation, Midland, MI (US)

( * ) Notice: Subject to any disclaimer, the term of this patent is extended or adjusted under 35 U.S.C. 154(b) by 46 days.

(21) Appl. No.: 13/144,096

(22) PCT Filed: Dec. 1, 2009

(86) PCT No.: PCT/US2009/066204
§ 371 (c)(1),
(2), (4) Date: Jul. 12, 2011

(87) PCT Pub. No.: WO2010/104534
PCT Pub. Date: Sep. 16, 2010

(65) Prior Publication Data
US 2011/0311767 A1 Dec. 22, 2011

Related U.S. Application Data (60) Provisional application No. 61/159,569, filed on Mar. 12, 2009.

(51) Int. Cl.
*B32B 9/04* (2006.01)
*C08L 83/04* (2006.01)

(52) U.S. Cl.
USPC ........... 428/447; 524/287; 524/294; 524/295; 524/296; 524/306; 524/308; 524/311; 524/315; 524/317; 524/404; 524/424; 524/428; 524/430; 524/437; 524/588; 525/477; 525/478; 528/15; 528/31; 528/32

(58) Field of Classification Search .................. None
See application file for complete search history.

(56) References Cited

U.S. PATENT DOCUMENTS

| | | | |
|---|---|---|---|
| 2,676,182 A | 4/1954 | Daudt et al. | |
| 2,938,007 A * | 5/1960 | Savage ........................ | 524/296 |
| 3,159,601 A | 12/1964 | Ashby | |
| 3,205,283 A | 9/1965 | Modic | |
| 3,220,972 A | 11/1965 | Lamoreaux | |
| 3,296,291 A | 1/1967 | Chalk et al. | |
| 3,419,593 A | 12/1968 | Willing | |
| 3,445,420 A | 5/1969 | Kookootsedes et al. | |
| 3,516,946 A | 6/1970 | Modic | |
| 3,814,730 A | 6/1974 | Karstedt | |
| 3,989,667 A | 11/1976 | Lee et al. | |
| 3,989,668 A | 11/1976 | Lee et al. | |
| 4,087,585 A | 5/1978 | Schulz | |
| 4,370,358 A | 1/1983 | Hayes et al. | |
| 4,544,696 A * | 10/1985 | Streusand et al. ........... | 524/428 |
| 4,584,355 A | 4/1986 | Blizzard et al. | |
| 4,584,361 A | 4/1986 | Janik et al. | |
| 4,585,836 A | 4/1986 | Homan et al. | |
| 4,591,622 A | 5/1986 | Blizzard et al. | |
| 4,707,531 A | 11/1987 | Shirahata | |
| 4,766,176 A | 8/1988 | Lee et al. | |
| 4,774,281 A | 9/1988 | Chaffee et al. | |
| 5,017,654 A | 5/1991 | Togashi et al. | |
| 5,036,117 A | 7/1991 | Chung et al. | |
| 5,194,649 A | 3/1993 | Okawa | |
| 5,310,843 A | 5/1994 | Morita | |
| 6,020,387 A | 2/2000 | Downey et al. | |
| 6,111,003 A * | 8/2000 | Nakanishi et al. ............ | 524/265 |
| 6,169,142 B1 | 1/2001 | Nakano et al. | |
| 6,197,859 B1 | 3/2001 | Green | |
| 6,395,855 B1 | 5/2002 | Luft et al. | |
| 6,399,209 B1 | 6/2002 | Misra et al. | |
| 6,791,839 B2 | 9/2004 | Bhagwagar | |
| 6,838,182 B2 | 1/2005 | Kropp et al. | |
| 7,118,693 B2 | 10/2006 | Glatkowski et al. | |
| 7,147,367 B2 * | 12/2006 | Balian et al. ..................... | 374/44 |
| 7,547,743 B2 * | 6/2009 | Goto et al. ..................... | 524/588 |
| 8,187,490 B2 * | 5/2012 | Tabei et al. .................. | 252/78.3 |
| 2002/0014692 A1 | 2/2002 | Yamada et al. | |
| 2005/0065285 A1 | 3/2005 | Buvat et al. | |
| 2005/0127329 A1 | 6/2005 | Wang et al. | |
| 2005/0181213 A1 | 8/2005 | Ishikawa et al. | |

(Continued)

FOREIGN PATENT DOCUMENTS

| | | |
|---|---|---|
| EP | 1069156 B1 | 10/2003 |
| EP | 1101167 B1 | 4/2006 |

(Continued)

OTHER PUBLICATIONS

Masakatsu, Okazaki, et. al., JP 2001-013973, Abstract only.
Manabu, Mitsutomi, et. al., JP 2005-272648, Abstract only.
"Hexamoll Dinch: Highest Eco-Efficiency in Analysis on Non-Phthalate Plasticizers", BASF The Chemical Company, Jul. 2008.j.
Otter, Rainer, Dr., "Case Study: Plasticisers for human contact applications," Product Safety Presentation, BASF The Chemical Company, Jan. 29-30, 2008, Brussels, Belgium.
"Hexamoll DINCH; Comparison of Hexamoll DINCH to Palatinol AH (DOP, DEHP) and Palatinol N (DINP)," BASF The Chemical Company, Aug. 2008, Pasadena, Texas.
Meier, Ludwig, "Plasticizers," Plastics Additives, BASF, 3rd Edition, Hanser Publishers, Munich, Germany, 1990.

*Primary Examiner* — Marc Zimmer
(74) *Attorney, Agent, or Firm* — Catherine U. Brown (57) ABSTRACT

A curable composition contains (A) a polyorganosiloxane base polymer having an average per molecule of at least two aliphatically unsaturated organic groups, optionally (B) a crosslinker having an average per molecule of at least two silicon bonded hydrogen atoms, (C) a catalyst, (D) a thermally conductive filler, and (E) an organic plasticizer. The composition can cure to form a thermally conductive silicone gel or rubber. The thermally conductive silicone rubber is useful as a thermal interface material, in both TIM1 and TIM2 applications. The curable composition may be wet dispensed and then cured in situ in an (opto)electronic device, or the curable composition may be cured to form a pad with or without a support before installation in an (opto)electronic device.

15 Claims, 1 Drawing Sheet

U.S. PATENT DOCUMENTS

| | | |
|---|---|---|
| 2005/0276963 A1 | 12/2005 | Kim et al. |
| 2007/0093618 A1 | 4/2007 | Cheng et al. |
| 2007/0145606 A1 | 6/2007 | Mahler et al. |
| 2007/0232772 A1 | 10/2007 | Ziche et al. |
| 2008/0001140 A1 | 1/2008 | Haitko et al. |
| 2008/0160317 A1 | 7/2008 | Haitko |
| 2008/0293878 A1 | 11/2008 | Funk et al. |

FOREIGN PATENT DOCUMENTS

| | | |
|---|---|---|
| WO | WO 00/05308 | 2/2000 |
| WO | WO 01/04194 A1 | 1/2001 |
| WO | WO 01/92380 A1 | 12/2001 |
| WO | WO 2005/033219 * | 4/2005 |
| WO | WO 2006/007243 A1 | 1/2006 |
| WO | WO 2006/106359 * | 12/2006 |
| WO | WO 2007/063046 A1 | 6/2007 |
| WO | WO 2007/086443 A1 * | 8/2007 |
| WO | WO 2007/126561 A1 | 11/2007 |
| WO | WO 2008/103219 A1 | 8/2008 |
| WO | WO 2008/126658 * | 10/2008 |
| WO | WO 2009/107757 A2 * | 9/2009 |

* cited by examiner

THERMAL INTERFACE MATERIALS AND METHODS FOR THEIR PREPARATION AND USE

CROSS REFERENCE TO RELATED APPLICATIONS

This application is a U.S. national stage filing under 35 U.S.C. §371 of PCT Application No. PCT/US09/066204 filed on Dec. 1, 2009, currently pending, which claims the benefit of U.S. Provisional Patent Application No. 61/159,569 filed Mar. 12, 2009 under 35 U.S.C. §119 (e). PCT Application No. PCT/US09/066204 and U.S. Provisional Patent Application No. 61/159,569 are hereby incorporated by reference.

STATEMENT REGARDING FEDERALLY FUNDED RESEARCH AND DEVELOPMENT

None.

BACKGROUND OF THE INVENTION

1. Field of the Invention

This invention relates to a thermal interface material (TIM). More particularly, this invention relates to a TIM comprising a cured silicone prepared by curing a curable silicone composition ("composition") comprising an organic plasticizer, a thermally conductive filler, and a curable silicone composition.

2. Background (Opto)electronic components such as semiconductors, transistors, integrated circuits (ICs), discrete devices, light emitting diodes (LEDs), and others known in the art are designed to operate at a normal operating temperature or within a normal operating temperature range. However, the operation of an (opto)electronic component generates heat. If sufficient heat is not removed, the (opto)electronic component will operate at a temperature significantly above its normal operating temperature. Excessive temperatures can adversely affect performance of the (opto)electronic component and operation of the device associated therewith and negatively impact mean time between failures.

To avoid these problems, heat can be removed by thermal conduction from the (opto)electronic component to a heat sink. The heat sink can then be cooled by any convenient means such as convection or radiation techniques. During thermal conduction, heat can be transferred from the (opto) electronic component to the heat sink by surface contact between the (opto)electronic component and the heat sink or by contact of the (opto)electronic component and heat sink with a TIM (TIM1 application). Alternatively, the TIM may be in contact with the heat sink and another component in the (opto)electronic device, e.g., a heat spreader such as a lid or cover (TIM2 application).

Surfaces of the (opto)electronic component and the heat sink are typically not completely smooth, therefore, it is difficult to achieve full contact between the surfaces. Air spaces, which are poor thermal conductors, appear between the surfaces and impede the removal of heat. Inserting a TIM between the surfaces of the (opto)electronic component and heat sink can fill these spaces to promote efficient heat transfer. The lower the thermal impedance of the TIM, the greater the heat flow from the (opto)electronic component to the heat sink.

Most TIMs are based on thermosetting or thermoplastic polymeric matrices. However, the thermal conductivity of conformable polymers is rather low, typically in the range of 0.15 to 0.30 W/mK. To increase the thermal conductivity of the TIM, thermally conductive fillers can be added to the polymeric matrices. The thermal conductivity of these filled TIMs depends on various factors including the thermal conductivity of filler and the packing of filler in the polymeric matrix as dictated by filler particle size and filler particle size distribution.

The effectiveness of the heat transfer between two substrates through the TIM is expressed in terms of thermal impedance or thermal resistance. The thermal impedance or thermal resistance is the summation of bulk resistance of the TIM and interfacial resistance between the TIM and the substrates. There is a continuing need in the (opto)electronics industry to produce TIMs having higher thermal conductivity, lower thermal impedance, with the ability to stay in place for the useful live of the (opto)electronic device. There is a continuing need in the (opto)electronics industry to produce TIMs with low softness, high compressibility, and low bleed out of impurities to increase thermal conductivity and lower thermal impedance.

BRIEF SUMMARY OF THE INVENTION

A composition is useful for thermal interface material applications. The composition comprises:

(A) a polyorganosiloxane base polymer having an average per molecule of at least two aliphatically unsaturated organic groups, optionally (B) a crosslinker having an average per molecule of at least two silicon bonded hydrogen atoms, (C) a catalyst, (D) a thermally conductive filler, and (E) an organic plasticizer.

A method for preparing a thermal interface material may comprise: 1) interposing the composition described above along a thermal path to dissipate heat from a heat source such as an (opto)electronic device, and 2) curing the composition. Step 2) may be performed before or after step 1).

REFERENCE NUMERALS 100 interface material
101 support
102 thermally conductive cured silicone
103 release liner
200 device according to this invention
201 heat sink
202 second interface material (TIM2)
203 electronic component
204 substrate
205 solder balls
206 first interface material (TIM1)
207 metal cover
208 thermal path
209 chip underfill
210 pads
211 solderball array

DETAILED DESCRIPTION OF THE INVENTION

All amounts, ratios, and percentages are by volume unless otherwise indicated. The following is a list of definitions, as used herein.

Definitions and Usage of Terms

The articles "a," "an," and "the" each mean one or more.

"Combination" means two or more items put together by any method.

"Organic plasticizer" means a non-silicone compound which reduces compression set of a cured silicone as compared to compression set of a cured silicone that does not contain the non-silicone compound.

"Soluble" means that when the ingredients of the composition are combined, the resulting combination remains a homogenous mixture during the method of curing the composition, e.g., the plasticizer does not form a separate phase.

Thermal conductivity (k) in units of (W/m K), is related to the ability to transfer heat (Q) across a material of thickness Δx and area A, resulting in a temperature differential of ΔT, and is mathematically defined by the equation:

$$\dot{Q} = k \frac{A}{\Delta x} \Delta T.$$

Thermal Impedance (R) in units of (cm² K/W) is related to the effectiveness of heat transfer of a material between 2 interfaces, and is mathematically defined by the equation:

$$R = \frac{A}{\dot{Q}} \Delta T = \frac{\Delta x}{k}.$$

"Surface treated" means that all, or a portion of, reactive groups on a filler particle have been rendered less reactive by any convenient chemical or unreactive means.

Composition

A composition comprises:
(A) a polyorganosiloxane base polymer having an average per molecule of at least two aliphatically unsaturated organic groups,
optionally (B) a crosslinker having an average per molecule of at least two silicon bonded hydrogen atoms,
(C) a catalyst selected from hydrosilylation reaction catalyst and peroxide cure catalysts,
(D) a thermally conductive filler, and
(E) an organic plasticizer soluble in ingredient (A), which does not inhibit curing of the composition The composition may be curable, for example, by hydrosilylation or peroxide cure. In the hydrosilylation curable composition, ingredient (B) is present. In the peroxide curable composition, ingredient (B) is optional.

Hydrosilylation Curable Composition

The hydrosilylation curable composition may comprise: 100 parts by weight of (A') a polyorganosiloxane base polymer having an average per molecule of at least two aliphatically unsaturated organic groups; (B') a crosslinker, such as a silane or siloxane, having an average per molecule of at least two silicon bonded hydrogen atoms; and an amount sufficient to initiate curing of the composition of (C') a platinum group metal catalyst, where the ingredients and amounts may be selected such that a cured silicone prepared by curing the composition is a silicone rubber.

Ingredient (A') Base Polymer

Ingredient (A') of the hydrosilylation curable composition may comprise a polyorganosiloxane having an average of at least two aliphatically unsaturated organic groups per molecule. Ingredient (A') may have a linear or branched structure. Ingredient (A') may be a homopolymer or a copolymer. The aliphatically unsaturated organic groups may be alkenyl exemplified by, but not limited to, vinyl, allyl, butenyl, and hexenyl. The unsaturated organic groups may be alkynyl groups exemplified by, but not limited to, ethynyl, propynyl, and butynyl. The aliphatically unsaturated organic groups in ingredient (A') may be located at terminal, pendant, or both terminal and pendant positions.

The remaining silicon-bonded organic groups in ingredient (A') may be monovalent organic groups free of aliphatic unsaturation. These monovalent organic groups may have 1 to 20 carbon atoms, alternatively 1 to 10 carbon atoms, and are exemplified by, but not limited to alkyl groups such as methyl, ethyl, propyl, pentyl, octyl, undecyl, and octadecyl; cycloalkyl groups such as cyclopentyl and cyclohexyl; and aromatic groups such as phenyl, tolyl, xylyl, benzyl, and 2-phenylethyl.

Ingredient (A') may comprise a polyorganosiloxane of $$R^6{}_2R^7SiO(R^6{}_2SiO)_d(R^6R^7SiO)_eSiR^6{}_2R^7, \quad \text{Formula (VII)}$$

$$R^6{}_3SiO(R^6{}_2SiO)_f(R^6R^7SiO)_gSiR^6{}_3, \quad \text{Formula (VIII)}$$

or a combination thereof.

In formulae (VII) and (VIII), each $R^6$ is independently a monovalent organic group free of aliphatic unsaturation and each $R^7$ is independently an aliphatically unsaturated organic group. Subscript d has an average value of at least 2, alternatively subscript d may have a value ranging from 2 to 2000. Subscript e may be 0 or a positive number. Alternatively, subscript e may have an average value ranging from 0 to 2000. Subscript f may be 0 or a positive number. Alternatively, subscript f may have an average value ranging from 0 to 2000. Subscript g has an average value of at least 2. Alternatively subscript g may have an average value ranging from 2 to 2000. Suitable monovalent organic groups for $R^6$ include, but are not limited to, alkyl such as methyl, ethyl, propyl, pentyl, octyl, undecyl, and octadecyl; cycloalkyl such as cyclopentyl and cyclohexyl; and aryl such as phenyl, tolyl, xylyl, benzyl, and 2-phenylethyl. Each $R^7$ is independently an aliphatically unsaturated monovalent organic group. $R^7$ is exemplified by alkenyl groups such as vinyl, allyl, and butenyl and alkynyl groups such as ethynyl and propynyl.

Ingredient (A') may comprise polydiorganosiloxanes such as
i) dimethylvinylsiloxy-terminated polydimethylsiloxane,
ii) dimethylvinylsiloxy-terminated poly(dimethylsiloxane/methylvinylsiloxane),
iii) dimethylvinylsiloxy-terminated polymethylvinylsiloxane,
iv) trimethylsiloxy-terminated poly(dimethylsiloxane/methylvinylsiloxane),
v) trimethylsiloxy-terminated polymethylvinylsiloxane,
vi) dimethylvinylsiloxy-terminated poly(dimethylsiloxane/methylphenylsiloxane),
vii) dimethylvinylsiloxy-terminated poly(dimethylsiloxane/diphenylsiloxane), viii) phenyl,methyl,vinyl-siloxy-terminated polydimethylsiloxane,
ix) dimethylhexenylsiloxy-terminated polydimethylsiloxane,
x) dimethylhexenylsiloxy-terminated poly(dimethylsiloxane/methylhexenylsiloxane),
xi) dimethylhexenylsiloxy-terminated polymethylhexenylsiloxane,
xii) trimethylsiloxy-terminated poly(dimethylsiloxane/methylhexenylsiloxane),
xiii) a combination thereof.

Methods of preparing polydiorganosiloxane fluids suitable for use as ingredient (A'), such as hydrolysis and condensation of the corresponding organohalosilanes or equilibration of cyclic polydiorganosiloxanes, are well known in the art.

In addition to the polydiorganosiloxane described above, ingredient (A') may further comprise a resin such as an MQ resin consisting essentially of $R^8{}_3SiO_{1/2}$ units and $SiO_{4/2}$ units, a TD resin consisting essentially of $R^8SiO_{3/2}$ units and $R^8{}_2SiO_{2/2}$ units, an MT resin consisting essentially of $R^8{}_3SiO_{1/2}$ units and $R^8SiO_{3/2}$ units, an MTD resin consisting essentially of $R^8{}_3SiO_{1/2}$ units, $R^8SiO_{3/2}$ units, and $R^8{}_2SiO_{2/2}$ units, or a combination thereof.

Each $R^8$ is a monovalent organic group. The monovalent organic groups represented by $R^8$ may have 1 to 20 carbon atoms. Examples of monovalent organic groups include, but are not limited to, monovalent hydrocarbon groups and monovalent halogenated hydrocarbon groups. Monovalent hydrocarbon groups include, but are not limited to, alkyl such as methyl, ethyl, propyl, pentyl, octyl, undecyl, and octadecyl; cycloalkyl such as cyclohexyl; alkenyl such as vinyl, allyl, butenyl, and hexenyl; alkynyl such as ethynyl, propynyl, and butynyl; and aryl such as phenyl, tolyl, xylyl, benzyl, and 2-phenylethyl.

The resin may contain an average of 3 to 30 mole percent of aliphatically unsaturated organic groups. The aliphatically unsaturated organic groups may be alkenyl groups, alkynyl groups, or a combination thereof. The mole percent of aliphatically unsaturated organic groups in the resin is the ratio of the number of moles of unsaturated group-containing siloxane units in the resin to the total number of moles of siloxane units in the resin, multiplied by 100.

Methods of preparing resins are well known in the art. For example, resin may be prepared by treating a resin copolymer produced by the silica hydrosol capping process of Daudt, et al. with at least an alkenyl-containing endblocking reagent. The method of Daudt et al., is disclosed in U.S. Pat. No. 2,676,182.

Briefly stated, the method of Daudt, et al. involves reacting a silica hydrosol under acidic conditions with a hydrolyzable triorganosilane such as trimethylchlorosilane, a siloxane such as hexamethyldisiloxane, or mixtures thereof, and recovering a copolymer having M and Q units. The resulting copolymers generally contain from 2 to 5 percent by weight of hydroxyl groups.

The resin, which typically contains less than 2 percent by weight of silicon-bonded hydroxyl groups, may be prepared by reacting the product of Daudt, et al. with an unsaturated organic group-containing endblocking agent and an endblocking agent free of aliphatic unsaturation, in an amount sufficient to provide from 3 to 30 mole percent of unsaturated organic groups in the final product. Examples of endblocking agents include, but are not limited to, silazanes, siloxanes, and silanes. Suitable endblocking agents are known in the art and exemplified in U.S. Pat. Nos. 4,584,355; 4,591,622; and 4,585,836. A single endblocking agent or a mixture of such agents may be used to prepare the resin.

Ingredient (A') can be one single base polymer or a combination comprising two or more base polymers that differ in at least one of the following properties: structure, viscosity, average molecular weight, siloxane units, and sequence.

Ingredient (B') Crosslinker

Ingredient (B') in the hydrosilylation cure package may be a silane or an organohydrogenpolysiloxane having an average of at least two silicon-bonded hydrogen atoms per molecule. The amount of ingredient (B') in the hydrosilylation curable composition depends on various factors including the SiH content of ingredient (B'), the unsaturated group content of ingredient (A'), and the properties of the cured product of the composition desired, however, the amount of ingredient (B') may be sufficient to provide a molar ratio of SiH groups in ingredient (B') to aliphatically unsaturated organic groups in ingredient (A') (commonly referred to as the SiH:Vi ratio) ranging from 0.3:1 to 5:1. Ingredient (B') can be a homopolymer or a copolymer. Ingredient (B') can have a linear, branched, cyclic, or resinous structure. The silicon-bonded hydrogen atoms in ingredient (B') can be located at terminal, pendant, or at both terminal and pendant positions.

Ingredient (B') may comprise siloxane units including, but not limited to, $HR^9{}_2SiO_{1/2}$, $R^9{}_3SiO_{1/2}$, $HR^9SiO_{2/2}$, $R^9{}_2SiO_{2/2}$, $R^9SiO_{3/2}$, and $SiO_{4/2}$ units. In the preceding formulae, each $R^9$ is independently selected from monovalent organic groups free of aliphatic unsaturation.

Ingredient (B') may comprise a compound of the formula (IX)

(X)

or a combination thereof.

In formulae (IX) and (X) above, subscript h has an average value ranging from 0 to 2000, subscript i has an average value ranging from 2 to 2000, subscript j has an average value ranging from 0 to 2000, and subscript k has an average value ranging from 0 to 2000. Each $R^9$ is independently a monovalent organic group. Suitable monovalent organic groups include alkyl such as methyl, ethyl, propyl, pentyl, octyl, undecyl, and octadecyl; cycloalkyl such as cyclopentyl and cyclohexyl; alkenyl such as vinyl, allyl, butenyl, and hexenyl; alkynyl such as ethynyl, propynyl, and butynyl; and aryl such as phenyl, tolyl, xylyl, benzyl, and 2-phenylethyl.

Ingredient (B') is exemplified by
a) dimethylhydrogensiloxy-terminated polydimethylsiloxane,
b) dimethylhydrogensiloxy-terminated poly(dimethylsiloxane/methylhydrogensiloxane),
c) dimethylhydrogensiloxy-terminated polymethylhydrogensiloxane,
d) trimethylsiloxy-terminated poly(dimethylsiloxane/methylhydrogensiloxane),
e) trimethylsiloxy-terminated polymethylhydrogensiloxane,
f) a resin consisting essentially of $H(CH_3)_2SiO_{1/2}$ units and $SiO_{4/2}$ units, and
g) a combination thereof.

Ingredient (B') may be a combination of two or more organohydrogenpolysiloxanes that differ in at least one of the following properties: structure, average molecular weight, viscosity, siloxane units, and sequence. Dimethylhydrogensiloxy-terminated polydimethylsiloxanes having relatively low degrees of polymerization (e.g., DP ranging from 3 to 50) are commonly referred to as chain extenders, and a portion of ingredient (B') may be a chain extender.

Methods of preparing linear, branched, and cyclic organohydrogenpolysiloxanes suitable for use as ingredient (B'), such as hydrolysis and condensation of organohalosilanes, are well known in the art. Methods of preparing organohydrogenpolysiloxane resins suitable for use as ingredient (B') are also well known as exemplified in U.S. Pat. Nos. 5,310,843; 4,370,358; and 4,707,531.

Ingredient (C') Hydrosilylation Catalyst

Ingredient (C') of the hydrosilylation curable composition is a hydrosilylation catalyst. Ingredient (C') is added to the hydrosilylation curable composition in an amount that may range from 0.1 ppm to 1000 ppm, alternatively 1 to 500 ppm, alternatively 2 to 200, alternatively 5 to 150 ppm, by weight of platinum group metal based on the weight of the curable composition.

Suitable hydrosilylation catalysts are known in the art and commercially available. Ingredient (C') may comprise a platinum group metal selected from platinum, rhodium, ruthenium, palladium, osmium or iridium metal or organometallic compound thereof, or a combination thereof. Ingredient (C') is exemplified by compounds such as chloroplatinic acid, chloroplatinic acid hexahydrate, platinum dichloride, and complexes of said compounds with low molecular weight organopolysiloxanes or platinum compounds microencapsulated in a matrix or coreshell type structure. Complexes of platinum with low molecular weight organopolysiloxanes include 1,3-diethenyl-1,1,3,3-tetramethyldisiloxane complexes with platinum. These complexes may be microencapsulated in a resin matrix. Alternatively, the catalyst may comprise 1,3-diethenyl-1,1,3,3-tetramethyldisiloxane complex with platinum. When the catalyst is a platinum complex with a low molecular weight organopolysiloxane, the amount of catalyst may range from 0.04 to 0.4% based on the weight of the curable silicone composition.

Suitable hydrosilylation catalysts for ingredient (C') are described in, for example, U.S. Pat. Nos. 3,159,601; 3,220,972; 3,296,291; 3,419,593; 3,516,946; 3,814,730; 3,989,668; 4,784,879; 5,036,117; and 5,175,325 and EP 0 347 895 B. Microencapsulated hydrosilylation catalysts and methods of preparing them are known in the art, as exemplified in U.S. Pat. No. 4,766,176; and U.S. Pat. No. 5,017,654.

Peroxide Curable Composition

Alternatively, the peroxide curable composition may comprise: 100 parts by weight of (A") a base polymer, optionally an amount sufficient to cure the composition of (B") a crosslinker, and an amount sufficient to accelerate curing of the composition of (C") a peroxide catalyst, where the ingredients and amounts are selected such that a cured product of the composition may be a silicone rubber.

Ingredient (A") Base Polymer

Ingredient (A") of the peroxide cure package may comprise a polydiorganosiloxane having an average of at least two aliphatically unsaturated organic groups per molecule, such as the polyorganosiloxane described above as ingredient (A') of the hydrosilylation cure package.

Optional Ingredient (B") Crosslinker

Ingredient (B") is a crosslinker, which may optionally be added to the peroxide curable composition to improve (reduce) compression set of a cured silicone prepared by curing this composition. The amount of ingredient (B") in the peroxide curable composition depends on various factors including the SiH content of ingredient (B"), the unsaturated group content of ingredient (A"), and the properties of the cured product of the composition desired, however, the amount of ingredient (B") may be sufficient to provide a molar ratio of SiH groups in ingredient (B") to aliphatically unsaturated organic groups in ingredient (A") (commonly referred to as the SiH:Vi ratio) ranging from 0.3:1 to 5:1. The amount of ingredient (B") in the composition may range from 0 to 15 parts (by weight) per 100 parts by weight of ingredient (A"). Ingredient (B") may comprise a polydiorganohydrogensiloxane having an average of at least two silicon-bonded hydrogen atoms per molecule. Ingredient (B") is exemplified by the polydiorganohydrogensiloxanes described as ingredient (B') in the hydrosilylation curable composition.

Ingredient (C") Catalyst

Ingredient (C") in the peroxide curable composition comprises a peroxide compound. The amount of ingredient (C") added to the composition depends on the specific peroxide compound selected for ingredient (C"), however, the amount may range from 0.2 to 5 parts (by weight), per 100 parts by weight of ingredient (A"). Examples of peroxide compounds suitable for ingredient (C") include, but are not limited to 2,4-dichlorobenzoyl peroxide, dicumyl peroxide, and a combination thereof; as well as combinations of such a peroxide with a benzoate compound such as tertiary-butyl perbenzoate. Suitable peroxide curable compositions are known in the art, and are disclosed in, for example, U.S. Pat. No. 4,774,281.

Thermally Conductive Filler

Ingredient (D) is a thermally conductive filler. Ingredient (D) may be both thermally conductive and electrically conductive. Alternatively, ingredient (D) may be thermally conductive and electrically insulating. Ingredient (D) may be selected from the group consisting of aluminum nitride, aluminum oxide, aluminum trihydrate, barium titanate, beryllium oxide, boron nitride, carbon fibers, diamond, graphite, magnesium hydroxide, magnesium oxide, metal particulate, onyx, silicon carbide, tungsten carbide, zinc oxide, and a combination thereof. Ingredient (D) may comprise a metallic filler, an inorganic filler, a meltable filler, or a combination thereof. Metallic fillers include particles of metals and particles of metals having layers on the surfaces of the particles. These layers may be, for example, metal nitride layers or metal oxide layers on the surfaces of the particles. Suitable metallic fillers are exemplified by particles of metals selected from the group consisting of aluminum, copper, gold, nickel, silver, and combinations thereof, and alternatively aluminum. Suitable metallic fillers are further exemplified by particles of the metals listed above having layers on their surfaces selected from the group consisting of aluminum nitride, aluminum oxide, copper oxide, nickel oxide, silver oxide, and combinations thereof. For example, the metallic filler may comprise aluminum particles having aluminum oxide layers on their surfaces.

Inorganic fillers are exemplified by onyx; aluminum trihydrate, metal oxides such as aluminum oxide, beryllium oxide, magnesium oxide, and zinc oxide; nitrides such as aluminum nitride and boron nitride; carbides such as silicon carbide and tungsten carbide; and combinations thereof. Alternatively, inorganic fillers are exemplified by aluminum oxide, zinc oxide, and combinations thereof. Meltable fillers may comprise Bi, Ga, In, Sn, or an alloy thereof. The meltable filler may optionally further comprise Ag, Au, Cd, Cu, Pb, Sb, Zn, or a combination thereof. Examples of suitable meltable fillers include Ga, In—Bi—Sn alloys, Sn—In—Zn alloys, Sn—In—Ag alloys, Sn—Ag—Bi alloys, Sn—Bi—Cu—Ag alloys, Sn—Ag—Cu—Sb alloys, Sn—Ag—Cu alloys, Sn—Ag alloys, Sn—Ag—Cu—Zn alloys, and combinations thereof. The meltable filler may have a melting point ranging from 50° C. to 250° C., alternatively 150° C. to 225° C. The meltable filler may be a eutectic alloy, a non-eutectic alloy, or a pure metal. Meltable fillers are commercially available.

For example, meltable fillers may be obtained from Indium Corporation of America, Utica, N.Y., U.S.A.; Arconium, Providence, R.I., U.S.A.; and AIM Solder, Cranston, R.I., U.S.A. Aluminum fillers are commercially available, for example, from Toyal America, Inc. of Naperville, Ill., U.S.A. and Valimet Inc., of Stockton, Calif., U.S.A. Silver filler is commercially available from Metalor Technologies U.S.A. Corp. of Attleboro, Mass., U.S.A.

Thermally conductive fillers are known in the art and commercially available, see for example, U.S. Pat. No. 6,169,142 (col. 4, lines 7-33). For example, CB-A20S and Al-43-Me are aluminum oxide fillers of differing particle sizes commercially available from Showa-Denko, and AA-04, AA-2, and AA18 are aluminum oxide fillers commercially available from Sumitomo Chemical Company. Zinc oxides, such as zinc oxides having trademarks KADOX® and XX®, are commercially available from Zinc Corporation of America of Monaca, Pa., U.S.A.

The shape of the thermally conductive filler particles is not specifically restricted, however, rounded or spherical particles may prevent viscosity increase to an undesirable level upon high loading of the thermally conductive filler in the composition.

Ingredient (D) may be a single thermally conductive filler or a combination of two or more thermally conductive fillers that differ in at least one property such as particle shape, average particle size, particle size distribution, and type of filler. For example, it may be desirable to use a combination of inorganic fillers, such as a first aluminum oxide having a larger average particle size and a second aluminum oxide having a smaller average particle size. Alternatively, it may be desirable, for example, use a combination of an aluminum oxide having a larger average particle size with a zinc oxide having a smaller average particle size. Alternatively, it may be desirable to use combinations of metallic fillers, such as a first aluminum having a larger average particle size and a second aluminum having a smaller average particle size. Alternatively, it may be desirable to use combinations of metallic and inorganic fillers, such as a combination of aluminum and aluminum oxide fillers; a combination of aluminum and zinc oxide fillers; or a combination of aluminum, aluminum oxide, and zinc oxide fillers. Use of a first filler having a larger average particle size and a second filler having a smaller average particle size than the first filler may improve packing efficiency, may reduce viscosity, and may enhance heat transfer.

The average particle size of the thermally conductive filler will depend on various factors including the type of thermally conductive filler selected for ingredient (D) and the exact amount added to the curable composition, as well as the bondline thickness of the device in which the cured product of the composition will be used when the cured product will be used as a TIM. However, the thermally conductive filler may have an average particle size ranging from 0.1 micrometer to 80 micrometers, alternatively 0.1 micrometer to 50 micrometers, and alternatively 0.1 micrometer to 10 micrometers.

The amount of ingredient (D) in the composition depends on various factors including the silicone cure mechanism selected for the composition and the thermally conductive filler selected for ingredient (D). However, the amount of ingredient (D) may range from 30% to 80%, alternatively 50% to 75% by volume of the composition. Without wishing to be bound by theory, it is thought that when the amount of filler is greater than 80%, the composition may crosslink to form a cured silicone with insufficient dimensional integrity for some applications, and when the amount of filler is less than 30%, the cured silicone prepared from the composition may have insufficient thermal conductivity for TIM applications.

Organic Plasticizer

The composition contains an organic plasticizer. Without wishing to be bound by theory, the organic plasticizer may improve the compression set properties of a cured silicone prepared by curing the composition. The plasticizer has an average, per molecule, of at least one group of formula (I).

(I)

where R represents a hydrogen atom or a monovalent organic group. Alternatively, R may represent a branched or linear monovalent hydrocarbon group. The monovalent organic group may be a branched or linear monovalent hydrocarbon group such as an alkyl group of 4 to 15 carbon atoms, alternatively 9 to 12 carbon atoms. Suitable plasticizers may be selected from the group consisting of adipates, carboxylates, phthalates, and a combination thereof.

Alternatively, the plasticizer may have an average, per molecule, of at least two groups of formula (I) bonded to carbon atoms in a cyclic hydrocarbon. The plasticizer may have general formula (II):

(II)

In formula (II), group X represents a cyclic hydrocarbon group having 3 or more carbon atoms, alternatively 3 to 15 carbon atoms. (Subscript x may have a value ranging from 1 to 12.) Group X may be saturated or aromatic. Each R" is independently a hydrogen atom or a branched or linear monovalent organic group. The monovalent organic group for R" may be an alkyl group such as methyl, ethyl, or butyl. Alternatively, the monovalent organic group for R" may be an ester functional group. Each $R^1$ is independently a branched or linear monovalent hydrocarbon group, such as an alkyl group of 4 to 15 carbon atoms.

Examples of organic plasticizers of formula (II) may have a formula (III), (IV), (V), or (VI) set forth below.

(III)

(IV)

(V)

(VI)

In formulae (III), (IV), (V), and (VI), $R^1$ is as described above. Formulae (III) and (IV) represent the cases where the cycloalkyl group in formula (III) and the aryl group in formula (IV) are unsubstituted. Formulae (V) and (VI) show that the cycloalkyl group in formula (V) and the aryl group in formula (VI) may be replaced with organic groups in which one or more of the hydrogen atoms bonded to the member atoms, in the cycloalkyl group of formula (III) or in the aryl group of formula (IV), shown is replaced with another monovalent organic group represented by R'. Each R' may be an alkyl group such as methyl, ethyl, or butyl. Alternatively, the monovalent organic group for R' may be an ester functional group.

Suitable plasticizers are known in the art and are commercially available. The plasticizer may comprise: bis(2-ethylhexyl)terephthalate; bis(2-ethylhexyl)-1,4-benzenedicarboxylate; 2-ethylhexyl methyl-1,4-benzenedicarboxylate; 1,2 cyclohexanedicarboxylic acid, dinonyl ester, branched and linear; bis(2-propylheptyl) phthalate; diisononyl adipate; trioctyl trimellitate; triethylene glycol bis(2-ethylhexanoate); di(2-ethylhexyl)phthalate; triacetin; bis(2-ethylhexyl)adipate; dimethyl phthalate; diethyl phthalate; dibutyl phthalate; di-2-ethylhexyladipate; 1,2,4-benzenetricarboxylic acid, tris (2-ethylhexyl)ester; a fatty acid ester; and a combination thereof. Alternatively, the plasticizer may be selected from the group consisting of: bis(2-ethylhexyl)terephthalate; bis (2-ethylhexyl)-1,4-benzenedicarboxylate; 2-ethylhexyl methyl-1,4-benzenedicarboxylate; 1,2 cyclohexanedicarboxylic acid, dinonyl ester, branched and linear; bis(2-propylheptyl)phthalate; diisononyl adipate; and a combination thereof. Examples of suitable plasticizers and their commercial sources include those listed below in Table 1.

The amount of plasticizer added to the composition depends on various factors including the type of the plasticizer selected and the other ingredients of the composition. The plasticizer may be soluble in the composition. The plasticizer may be selected such that the plasticizer does not inhibit the curing reaction of the composition. However, the amount of the plasticizer may range from 2 wt % to 50 wt %, alternatively 3 wt % to 25 wt %, based on the combination of base polymer and crosslinker described below. Without wishing to be bound by theory it is thought that less than 2 wt % may be insufficient to improve compression set of a cured silicone prepared by curing the composition, and more than 50 wt % can be insoluble in the composition, resulting in loss of stability or the plasticizer bleeding out of the cured silicone prepared by curing the composition.

TABLE 1

| Product Name | Weight % | Component | CAS Registry No. |
|---|---|---|---|
| Eastman(TM) 425 Plasticizer | 75% | bis(2-ethylhexyl) terephthalate | 6422-86-2 |
| Eastman(TM) 168 Plasticizer | >98% | bis(2-ethylhexyl)-1,4-benzenedicarboxylate | 6422-86-2 |
| | <2% | 2-ethylhexyl methyl-1,4-benzenedicarboxylate | 63468-13-3 |
| Eastman(TM) 168-CA Plasticizer | >97% | bis(2-ethylhexyl)-1,4-benzenedicarboxylate | 6422-86-2 |
| | <2% | 2-ethylhexyl methyl-1,4-benzenedicarboxylate | 63468-13-3 |
| BASF Hexamoll *DINCH | >99.5% | 1,2 cyclohexanedicarboxylic acid, dinonyl ester, branched and linear | 474919-59-0 |
| BASF Palatinol ® DPHP | 99.9% | bis(2-propylheptyl) phthalate or Di- (2-Propyl Heptyl) Phthalate | 53306-54-0 |
| BASF Palamoll ® 652 | 96.0% | PMN00-0611 | 208945-13-5 |
| | 4.0% | diisononyl adipate | 33703-08-1 |
| Eastman 168 Xtreme (TM) Plasticizer | 100% | plasticizer | unknown |
| Eastman(TM) TOTM Plasticize | >99.9% | trioctyl trimellitate | 3319-31-1 |
| Eastman(TM) TEG-EH Plasticizer | 100% | triethylene glycol bis(2-ethylhexanoate) | 94-28-0 |
| Eastman(TM) DOP Plasticizer | 100% | di(2-ethylhexyl) phthalate | 117-81-7 |
| Eastman(TM) Triacetin | 100% | triacetin | 102-76-1 |
| Eastman(TM) DOA Plasticizer | 100% | bis(2-ethylhexyl) adipate | 103-23-1 |
| Eastman(TM) DOA Plasticizer, Kosher | 100% | bis(2-ethylhexyl) adipate | 103-23-1 |

TABLE 1-continued

| Product Name | Weight % | Component | CAS Registry No. |
|---|---|---|---|
| Eastman(TM) DMP Plasticizer | 100% | dimethyl phthalate | 131-11-3 |
| Eastman(TM) DEP Plasticizer | 100% | diethyl phthalate | 84-66-2 |
| Eastman(TM) DBP Plasticizer | 100% | dibutyl phthalate | 84-74-2 |
| BASF Plastomoll ® DOA | >99.5% | Di-2-ethylhexyladipate | 103-23-1 |
| BASF Palatinol ® TOTM-I | >99% | 1,2,4-Benzenetricarboxylic acid, tris(2-ethylhexyl) ester | 3319-31-1 |

Optional Ingredients

The composition may optionally further comprise one or more additional ingredients. The additional ingredient may be selected from the group consisting of (F) a spacer, (G) a reinforcing or extending filler, (H) filler treating agent, (I) an adhesion promoter, (J) a vehicle, (K) a surfactant, (L) a flux agent, (M) an acid acceptor, (N) a stabilizer (e.g., a hydrosilylation cure stabilizer, a heat stabilizer, or a UV stabilizer), and a combination thereof.

(F) Spacer

Ingredient (F) is a spacer. Spacers can comprise organic particles, inorganic particles, or a combination thereof. Spacers can be thermally conductive, electrically conductive, or both. Spacers can have a particle size of at least 25 micrometers up to 125 micrometers. Spacers can comprise monodisperse beads, such as glass or polymer (e.g., polystyrene) beads. Spacers can comprise thermally conductive fillers such as alumina, aluminum nitride, atomized metal powders, boron nitride, copper, and silver. The amount of ingredient (F) depends on various factors including the particle size distribution, pressure to be applied during placement of the curable composition or cured product prepared therefrom, and temperature during placement. However, the composition may contain an amount of ingredient (F) ranging from 0.05% to 2%, alternatively 0.1% to 1%. Ingredient (F) may be added to control bondline thickness of the cured product of the curable composition.

(G) Filler

Ingredient (G) is a reinforcing and/or extending filler. The amount of ingredient (G) in the composition depends on various factors including the materials selected for ingredients (A), (B), (C), (D) and (E) and the end use of the composition. However, the amount of ingredient (G) may range from 0.1 wt % to 10 wt % based on the weight of the composition. Suitable reinforcing and extending fillers are known in the art and are exemplified by precipitated and ground silica, precipitated and ground calcium carbonate, quartz, talc, chopped fiber such as chopped KEVLAR®, or a combination thereof.

(H) Filler Treating Agent

The thermally conductive filler for ingredient (D) and the reinforcing and/or extending filler for ingredient (G) and/or the spacer for ingredient (F), if present, may optionally be surface treated with ingredient (H) a treating agent. Treating agents and treating methods are known in the art, see for example, U.S. Pat. No. 6,169,142 (col. 4, line 42 to col. 5, line 2).

The amount of ingredient (H) may vary depending on various factors including the type and amounts of fillers selected for ingredients (D) and (G) and whether the filler is treated with ingredient (H) in situ or before being combined with other ingredients of the composition. However, the composition may comprise an amount ranging from 0.1% to 2% of ingredient (H).

The ingredient (H) may comprise an alkoxysilane having the formula: $R^{10}_m Si(OR^{11})_{(4-m)}$, where subscript m is 1, 2, or 3; alternatively m is 3. Each $R^{10}$ is independently a monovalent organic group, such as a hydrocarbon group of 1 to 50 carbon atoms, alternatively 6 to 18 carbon atoms. $R^{10}$ is exemplified by alkyl groups such as hexyl, octyl, dodecyl, tetradecyl, hexadecyl, and octadecyl; and aromatic groups such as benzyl, phenyl and phenylethyl. $R^{10}$ can be saturated or unsaturated, branched or unbranched, and unsubstituted. $R^{10}$ can be saturated, unbranched, and unsubstituted.

Each $R^{11}$ may be an unsubstituted, saturated hydrocarbon group of 1 to 4 carbon atoms, alternatively 1 to 2 carbon atoms. Alkoxysilanes for ingredient (H) are exemplified by hexyltrimethoxysilane, octyltriethoxysilane, decyltrimethoxysilane, dodecyltrimethoxysilane, tetradecyltrimethoxysilane, phenyltrimethoxysilane, phenylethyltrimethoxysilane, octadecyltrimethoxysilane, octadecyltriethoxysilane, and a combination thereof.

Alkoxy-functional oligosiloxanes can also be used as treatment agents. Alkoxy-functional oligosiloxanes and methods for their preparation are known in the art, see for example, EP 1 101 167 A2. For example, suitable alkoxy-functional oligosiloxanes include those of the formula $(R^{14}O)_n Si(OSiR^{12}_2 R^{13})_{(4-n)}$. In this formula, subscript n is 1, 2, or 3, alternatively n is 3. Each $R^{12}$ can be independently selected from saturated and unsaturated monovalent hydrocarbon groups of 1 to 10 carbon atoms. Each $R^{13}$ can be a saturated or unsaturated monovalent hydrocarbon group having at least 11 carbon atoms. Each $R^{14}$ can be an alkyl group.

Metal fillers can be treated with alkylthiols such as octadecyl mercaptan and others, and fatty acids such as oleic acid, stearic acid, titanates, titanate coupling agents, zirconate coupling agents, and a combination thereof.

Treatment agents for alumina or passivated aluminum nitride may include alkoxysilyl functional alkylmethyl polysiloxanes (e.g., partial hydrolysis condensate of $R^{15}_o R^{16}_p Si(OR^{17})_{(4-o-p)}$ or cohydrolysis condensates or mixtures), or similar materials where the hydrolyzable group may comprise silazane, acyloxy or oximo. In all of these, a group tethered to Si, such as $R^{15}$ in the formula above, is a long chain unsaturated monovalent hydrocarbon or monovalent aromatic-functional hydrocarbon. Each $R^{16}$ is independently a monovalent hydrocarbon group, and each $R^{17}$ is independently a monovalent hydrocarbon group of 1 to 4 carbon atoms. In the formula above, subscript o is 1, 2, or 3 and subscript p is 0, 1, or 2, with the proviso that the sum o+p is 1, 2, or 3. One skilled in the art could optimize a specific treatment to aid dispersion of the filler without undue experimentation.

(I) Adhesion Promoter

Ingredient (I) is an adhesion promoter. Suitable adhesion promoters may comprise alkoxysilanes of the formula $R^{18}_q Si$ $(OR^{19})_{(4-q)}$, where subscript q is 1, 2, or 3, alternatively q is 3. Each $R^{18}$ is independently a monovalent organofunctional group. $R^{18}$ can be an epoxyfunctional group such as glycidoxypropyl or (epoxycyclohexyl)ethyl, an amino functional group such as aminoethylaminopropyl or aminopropyl, a methacryloxypropyl, or an unsaturated organic group. Each $R^{19}$ is independently an unsubstituted, saturated hydrocarbon group of at least 1 carbon atom. $R^{19}$ may have 1 to 4 carbon atoms, alternatively 1 to 2 carbon atoms. $R^{19}$ is exemplified by methyl, ethyl, n-propyl, and iso-propyl.

Examples of suitable adhesion promoters include glycidoxypropyltrimethoxysilane and a combination of glycidoxypropyltrimethoxysilane with an aluminum chelate or zirconium chelate. Examples of adhesion promoters for hydrosilylation curable compositions may be found in U.S. Pat. Nos. 4,087,585 and 5,194,649. The curable composition may comprise 2% to 5% of adhesion promoter based on the weight of the composition.

(J) Vehicle

Ingredient (J) is a vehicle such as a solvent or diluent. Ingredient (J) can be added during preparation of the composition, for example, to aid mixing and delivery. All or a portion of ingredient (J) may optionally be removed after the composition is prepared.

(K) Surfactant

Ingredient (K) is a surfactant. Suitable surfactants include silicone polyethers, ethylene oxide polymers, propylene oxide polymers, copolymers of ethylene oxide and propylene oxide, other non-ionic surfactants, and combinations thereof. The composition may comprise up to 0.05% of the surfactant based on the weight of the composition.

(L) Flux Agent

Ingredient (L) is a flux agent. The composition may comprise up to 2% of the flux agent based on the weight of the composition. Molecules containing chemically active functional groups such as carboxylic acid and amines can be used as flux agents. Such flux agents can include aliphatic acids such as succinic acid, abietic acid, oleic acid, and adipic acid; aromatic acids such as benzoic acids; aliphatic amines and their derivatives, such as triethanolamine, hydrochloride salts of amines, and hydrobromide salts of amines. Flux agents are known in the art and are commercially available.

(M) Acid Acceptor

Ingredient (M) is an acid acceptor. Suitable acid acceptors include magnesium oxide, calcium oxide, and combinations thereof. The composition may comprise up to 2% of ingredient (M) based on the weight of the composition.

(N) Stabilizer

Ingredient (N) is a stabilizer. Stabilizers for hydrosilylation curable compositions are exemplified by acetylenic alcohols such as methyl butynol, ethynyl cyclohexanol, dimethyl hexynol, and 3,5-dimethyl-1-hexyn-3-ol, 1,1-dimethyl-2-propynyl)oxy)trimethylsilane, methyl(tris(1,1-dimethyl-2-propynyloxy))silane, and a combination thereof; cycloalkenylsiloxanes such as methylvinylcyclosiloxanes exemplified by 1,3,5,7-tetramethyl-1,3,5,7-tetravinylcyclotetrasiloxane, 1,3,5,7-tetramethyl-1,3,5,7-tetrahexenylcyclotetrasiloxane, and a combination thereof; ene-yne compounds such as 3-methyl-3-penten-1-yne, 3,5-dimethyl-3-hexen-1-yne; triazoles such as benzotriazole; phosphines; mercaptans; hydrazines; amines such as tetramethyl ethylenediamine, dialkyl fumarates, dialkenyl fumarates, dialkoxyalkyl fumarates, maleates such as diallyl maleate, and a combination thereof. Alternatively, the stabilizer may comprise an acetylenic alcohol. Suitable hydrosilylation cure stabilizers are disclosed by, for example, U.S. Pat. Nos. 3,445,420; 3,989,667; 4,584,361; and 5,036,117.

The amount of stabilizer added to the composition will depend on the particular stabilizer used and the composition and amount of crosslinker. However, the amount of hydrosilylation cure stabilizer may range from 0.0025% to 0.025% based on the weight of the hydrosilylation curable composition.

One skilled in the art would recognize when selecting ingredients for the composition described above, there may be overlap between types of ingredients because certain ingredients described herein may have more than one function. For example, certain alkoxysilanes may be useful as filler treating agents and as adhesion promoters, and certain plasticizers such as fatty acid esters may also be useful as filler treating agents. One skilled in the art would be able to distinguish among and select appropriate ingredients, and amounts thereof, based on various factors including the intended use of the composition and whether the composition will be prepared as a one-part or multiple-part composition.

Method of Preparation of the Composition

The composition can be formulated to form a cured silicone having a thermal conductivity ranging from 0.2 to 7 W/mK. Thermal impedance depend on various factors including the thickness of the cured silicone and the amount and type of the filler selected for ingredient (D).

The composition can be prepared by a method comprising combining all ingredients by any convenient means such as mixing at ambient or elevated temperature. When the composition is prepared at elevated temperature, the temperature during preparation is less than the curing temperature of the composition.

When ingredient (H) is present, the composition may optionally be prepared by surface treating ingredient (D) (and ingredient (G), if present) with ingredient (H) and thereafter mixing the product thereof with the other ingredients of the composition.

Alternatively, the composition may be prepared as a multiple part composition, for example, when ingredient (N) is absent or when the composition will be stored for a long period of time before use. In the multiple part composition, the crosslinker and catalyst are stored in separate parts, and the parts are combined shortly before use of the composition. For example, a two part curable silicone composition may be prepared by combining ingredients comprising base polymer, catalyst, thermally conductive filler and plasticizer, and one or more additional ingredients in a base part by any convenient means such as mixing. A curing agent part may be prepared by combining ingredients comprising crosslinker, base polymer, thermally conductive filler and plasticizer, and one or more additional ingredients by any convenient means such as mixing. The ingredients may be combined at ambient or elevated temperature, depending on the cure mechanism selected. When a two part curable silicone composition is used, the weight ratio of amounts of base to curing agent may range from 1:1 to 10:1. One skilled in the art would be able to prepare a curable composition without undue experimentation.

Methods of Use

The composition described above may be used to form a TIM. A method of forming a TIM may comprise:
1) interposing the composition described above along a thermal path between a heat source and a heat dissipator, and
2) heating the composition to a temperature sufficient to cure the composition, thereby forming a thermal interface material. In step 1), the composition can be applied either to the heat source (e.g., (opto)electronic component) and thereafter the heat dissipator, the composition can be applied to the heat dissipator and thereafter to the heat source, or the composition can be applied to the heat source and heat dissipator simultaneously.

Alternatively, the method may comprise
1) curing the composition described above, and thereafter
2) interposing the product of step 1) along a thermal path between a heat source and a heat dissipator. In step 2), the product of step 1) can be applied either to the heat source (e.g., (opto)electronic component) and thereafter the heat dissipator, the composition can be applied to the heat dissipator and thereafter to the heat source, or the composition can be applied to the heat source and heat dissipator simultaneously. This method optionally further comprises the step of applying the composition to a support before step 1). The product of this method is an interface material.

The interface material comprises: I) a cured silicone prepared by curing the composition described above, where the cured silicone is formed as a flat member, a hemispherical nubbin, a convex member, a pyramid, or a cone. The composition may optionally be applied to a surface of a support before step 1). The support is exemplified by a carbon fiber mesh, metal foil, a perforated metal foil (mesh), a filled or unfilled plastic film (such as a polyamide sheet, a polyimide sheet, polyethylene naphthalate sheet, a polyethylene terephthalate polyester sheet, a polysulfone sheet, a polyether imide sheet, or a polyphenylene sulfide sheet), or a woven or nonwoven substrate (such as fiberglass cloth, fiberglass mesh, or aramid paper). The composition may be coated on two sides of the support. The interface material may further comprise II) a release sheet covering a surface of the cured silicone opposite the support.

Figure 1:
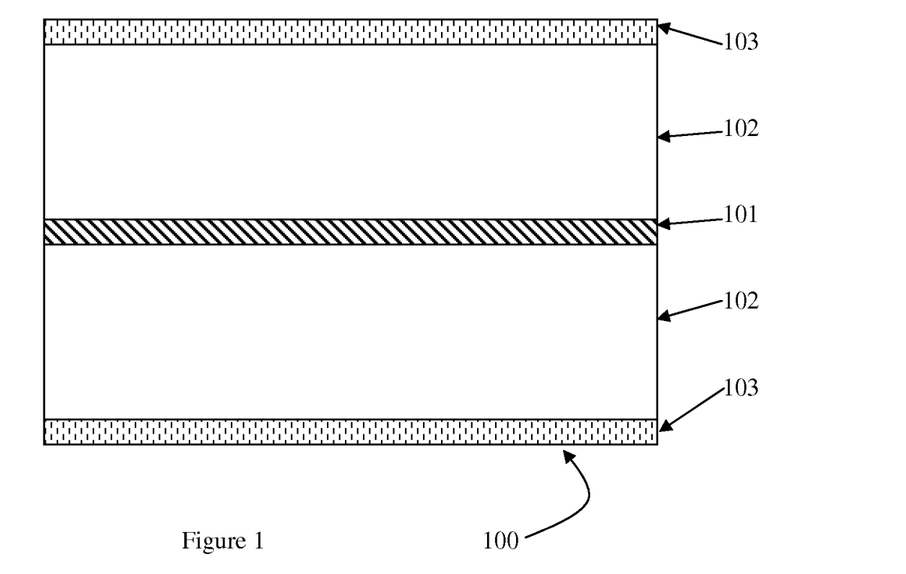
FIG. 1 is a partial cross section of an exemplary interface material.

A cross section of an exemplary interface material 100 is shown in FIG. 1. The interface material 100 comprises a support 101 having layers of cured silicone 102 on opposing surfaces of the support. The cured silicone 102 is prepared by curing the composition described above. Release liners 103 cover the exposed surfaces of the layers of cured silicone 102. The release liners 103 protect the surfaces during storage and shipping, and are removed before use of the interface material 100 for TIM applications.

A device comprises:
a) a heat source,
b) a thermal interface material described above, and
c) a heat dissipator;
where the thermal interface material is positioned between the heat source and the heat dissipator along a thermal path extending from a surface of the heat source to a surface of the heat spreader.

Figure 2:
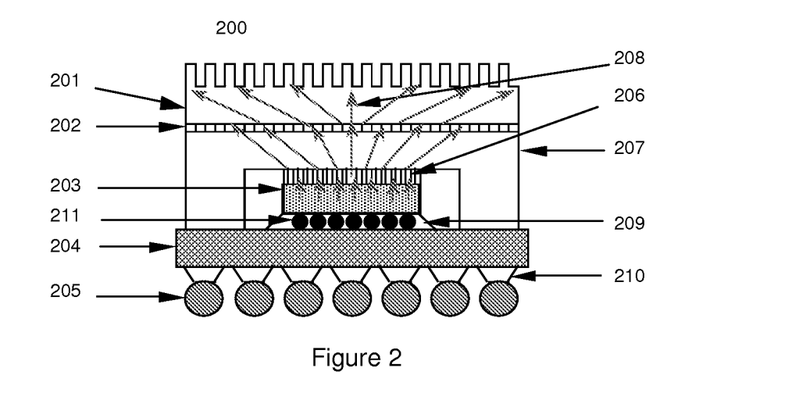
FIG. 2 is a cross section of an exemplary (opto)electronic device.

FIG. 2 shows a cross section of an exemplary device 200 described herein. The device 200 comprises an electronic component (shown as an integrated circuit (IC) chip) 103 mounted to a substrate (e.g., printed circuit board) 204 by a solderball array 211 and chip underfill 209. The substrate 204 has solder balls 205 attached thereto through pads 210. A first interface material (TIM1) 206 is interposed between the IC chip 203 and a metal cover 207. The metal cover 207 acts as a heat spreader. A second interface material (TIM2) 202 is interposed between the metal cover 207 and a heat sink 201. Heat moves along a thermal path represented by arrows 208 when the device operates.

In the methods and devices described herein, the heat source may comprise an (opto)electronic component such as a light emitting diode (LED), a semiconductor, a transistor, an integrated circuit, or a discrete device. The heat dissipator may comprise a heat sink, a thermally conductive plate, a thermally conductive cover, a fan, a circulating coolant system, or a combination thereof.

EXAMPLES

These examples are intended to illustrate the invention to one skilled in the art and should not be interpreted as limiting the scope of the invention set forth in the claims. The following raw materials were used to prepare samples in these examples. Ingredient A1) was a dimethylvinylsiloxy-terminated polydimethylsiloxane having a viscosity ranging from 300 to 600 centiPoise (cP). Ingredient B1) was a trimethylsiloxy terminated poly(dimethyl/methylhydrogen siloxane) copolymer of general formula $Me_3SiO(MeHSiO)_5(Me_2SiO)_3SiMe_3$ where Me represents a methyl group. Ingredient C1) was a mixture of 1.4 wt % 1,3-diethenyl-1,1,3,3-tetramethyldisiloxane complex with platinum, 6.6 wt % tetramethyldivinyldisiloxane, and the balance of a dimethylvinylsiloxy-terminated polydimethylsiloxane having a viscosity ranging from 300 to 600 cP. Ingredient D1) was aluminum powder sold under the tradename ABW-437 from Toyal America, Inc. of Lockport, Ill., USA. Ingredient D1) was surface treated with 1 wt % n-octyltriethoxysilane. Ingredient D2) was aluminum powder sold under the name ABY-499, also from Toyal America, Inc. Ingredient D2) was surface treated with 1 wt % n-octyltriethoxysilane. Ingredient D3) was zinc oxide sold under the tradename Kadox 911 by Zinc Corporation of America, and surface treated with 1 wt % n-octyltriethoxysilane. Ingredient D4) was aluminum oxide commercially available as AS-400 from Showa Denko KK. Ingredient D4) was surface treated with 1 wt % n-octyltriethoxysilane. Ingredient E1) was 1,2 cyclohexanedicarboxylic acid, dinonyl ester, branched and linear. Ingredient E2) was diundecyl phthalate (DUP). Ingredient F1) was a stabilizer, namely tetramethyltetravinylcyclotetrasiloxane.

Preparation Example 1

Two part composition samples were prepared by adding ingredient A1) to a 200 gram cup mixing for 10 seconds at the highest speed on a dental mixer. To this ingredient was added 75 wt % of the combined amounts of ingredients D1), D2), and D3). The resulting combination was mixed twice at highest speed for 5 seconds each, allowing cooling time in between mixes. This procedure was repeated with the remaining amounts of fillers for ingredients D1), D2), and D3). The sides of the cup were manually scraped and the contents were mixed one more time for 5 seconds at the highest speed. Ingredient F1) was added to Part B. Ingredient E1) was added to Part A as the last ingredient.

The resulting mixtures were de-aired for 15 minutes in a spin cycle mixer and cooled to room temperature to form Parts A and B of the samples. The ingredients in Table 1 were combined as described above to make the two part compositions.

TABLE 1

Sample 1 and Comparative Sample 2 ingredients

| Ingredient | Sample 1 Part A | Sample 1 Part B | Sample 2 Part A | Sample 2 Part B |
|---|---|---|---|---|
| A1 | 9.1 wt parts | 9.2 wt parts | 9.7 wt parts | 9.8 wt parts |
| B1 | 0 wt parts | 0.2 wt parts | 0 wt parts | 0.2 wt parts |
| C1 | 0.3 wt parts | 0 wt parts | 0.3 wt parts | 0 wt parts |
| D1 | 48.7 wt parts | 48.7 wt parts | 48.7 wt parts | 48.7 wt parts |
| D2 | 24.4 wt parts | 24.4 wt parts | 24.4 wt parts | 24.4 wt parts |
| D3 | 16.9 wt parts | 16.9 wt parts | 16.9 wt parts | 16.9 wt parts |
| E1 | 0.6 wt parts | 0.6 wt parts | 0 wt parts | 0 wt parts |
| F1 | 0 wt parts | 0.01 wt parts | 0 wt parts | 0.01 wt parts |

Equal weights of sample 1 part A and sample 1 part B were mixed and cured to form a TIM Sample 1 shortly before testing. Equal weights of sample 2 part A and sample 2 part B were mixed and cured to form a comparative TIM Sample 2 without plasticizer shortly before testing.

Example 1 and Comparative Example 2

Compressibility of TIM Sample 1 and TIM Sample 2 were evaluated using a texture analyzer with a ½ inch diameter circular probe. Each sample was exposed to different loads, and change in thickness of the sample was measured according to ASTM Standard D575. The results are in Table 2.

TABLE 2

Compressibility results

| Pressure (psi) | % Compression of TIM Sample 1 | % Compression of TIM Sample 2 |
|---|---|---|
| 10 | 16 | 7 |
| 20 | 20 | 8 |
| 30 | 26 | 12 |
| 40 | 31 | 15 |
| 50 | 35 | 18 |
| 60 | 36 | 21 |
| 70 | 36 | 23 |
| 80 | 36 | 26 |
| 90 | 36 | 28 |
| 100 | 36 | 31 |

One skilled in the art would recognize that the operative pressure for most (opto)electronic devices would be up to 40 psi. Without wishing to be bound by theory, it is thought that operating the (opto)electronic devices at pressures exceeding 40 psi could reduce the useful life of the device. However, in the formulations of TIM samples 1 and 2, TIM sample 1, which contained plasticizer, had consistently better compression than comparative TIM sample 2, which did not contain plasticizer.

Samples 1 and 2 were also tested for compression set. The result was expressed as a percentage of the permanent deformation (deflection) under a load with 25% deflection after 2 days at 100° C. For sample 1, 28 psi had to be applied to maintain 25% deflection for 2 days. Sample 1 had 0% compression set. For sample 2, 79 psi had to be applied to maintain 25% deflection for 2 days at 100° C. Sample 2 had compression set of 23%.

Example 3 and Comparative Example 4

A two part composition was prepared by adding ingredient A1) to a Sigmablend mixer. To this ingredient was added 75 wt % of the combined amounts of ingredients D1) and D4). The resulting combination was mixed twice at the highest speed, allowing cooling time in between mixes. This procedure was repeated with the remaining amounts of fillers for ingredients D1) and D4). Ingredient E1) was added to Part A as the last ingredient. Ingredient F1) was added to Part B as the last ingredient. The sides of the vessel were manually scraped and the contents were mixed one more time for 5 seconds at the highest speed.

The resulting mixtures were de-aired for 15 minutes in a spin cycle mixer and cooled to room temperature to form Parts A and B of the samples. The ingredients in Table 4 were combined as described above to make the two part compositions.

TABLE 4

| Ingredient | Sample 3 Part A | Sample 3 Part B | Sample 4 Part A | Sample 4 Part B |
|---|---|---|---|---|
| A1 | 170 weight parts | 172 weight parts | 5.3 weight parts | 5.3 weight parts |
| B1 | 0 | 3.3 weight parts | 0 | 0.1 weight part |
| C1 | 5.2 weight parts | 0 | 0.16 weight part | 0 |
| D1 | 378 weight parts | 378 weight parts | 378 weight parts | 378 weight parts |
| D4 | 3403 weight parts | 3403 weight parts | 3403 weight parts | 3403 weight parts |
| E1 | 43.8 weight parts | 43.8 weight parts | 0 | 0 |
| F1 | 0 | 0.15 weight parts | 0 | 0.005 weight part |

Parts A and B were mixed in a 1:1 ratio and cured at 100° C. for 0.5 hour. Comparative sample 4 was prepared as described above, except the plasticizer (ingredient E1) was omitted. The composition was difficult to dispense and the cured product of the composition of comparative example 4 was hard and brittle.

Examples 5-7 and Comparative Examples 8-10

Samples were prepared as in example 3 and comparative example 4, except the amount of filler varied. Sample 5 contained 90 wt % filler and 10 wt % matrix. Sample 6 contained 92 wt % filler and 8 wt % matrix. Sample 7 contained 94.5 wt % filler and 5.5 wt % matrix. Comparative sample 8 contained 90 wt % filler and 10 wt % matrix. Comparative sample 9 contained 92 wt % filler and 8 wt % matrix. Comparative sample 10 contained 94.5 wt % filler and 5.5 wt % matrix. Hardness was measured according to ASTM Standard D2240 on a Shore 00 scale.

For each sample, a 200 cc cartridge was filled with Part A and Part B in a 1:1 ratio.

The cartridge was purged, and the composition was dispensed through a 9 inch static mixer on a mold to create a puck 250 mil thick with a 1 inch diameter. The puck was cured and tested for hardness according to ASTM Standard D2240.

TABLE 6

Average Hardness Results

| % Filler | Samples 5-7 With Hexamol | Samples 8-10 without Hexamol | % improvement |
|---|---|---|---|
| 90 | 62 | 77 | 19 |
| 92 | 65 | 79 | 18 |
| 94.5 | 73 | 83 | 12 |

Examples 5-7 and comparative examples 8-10 show the plasticizer reduces hardness in each of samples 5-7.

INDUSTRIAL APPLICABILITY

The composition described above is useful for forming a TIM that can be used in TIM1 or TIM2 applications. The composition may be interposed along a thermal path in a device by dispensing and curing in place. Alternatively, the composition may be cured to form a form stable interface material, such as pad, and then put in a device by a pick and place method. The organic plasticizer in the composition provides the benefit of improved (reduced) compression set as compared to the same composition without the plasticizer, allowing improved surface contact between substrates along the thermal path, and thereby improving heat transfer.

The composition described above is versatile and may be formulated to cure to form a silicone gel or more highly crosslinked silicone rubber. For example, at higher plasticizer loading and lower filler loading in the curable composition, the cured product may be a dispensable gel. Alternatively, at lower filler loadings, higher plasticizer loading does not result in bleed out of the plasticizer. Alternatively, the cured product of the composition may be a silicone rubber, which is more crosslinked than a gel.

The invention claimed is:

1. A method comprising:
   1) curing a composition comprising:
      (A) a polyorganosiloxane base polymer having an average per molecule of at least two aliphatically unsaturated organic groups,
      optionally (B) a crosslinker having an average per molecule of at least two silicon bonded hydrogen atoms,
      (C) a catalyst selected from hydrosilylation reaction catalyst and peroxide cure catalysts,
      (D) a thermally conductive filler, and
      (E) an organic plasticizer soluble in ingredient (A), which does not inhibit curing of the composition, thereby preparing a cured silicone, and thereafter
   2) interposing the composition of step 1) along a thermal path between a heat source and a heat dissipator.

2. The method of claim 1, where ingredient (D) comprises: aluminum nitride, aluminum oxide, aluminum trihydrate, barium titanate, beryllium oxide, boron nitride, carbon fibers, diamond, graphite, magnesium hydroxide, magnesium oxide, metal particulate, onyx, silicon carbide, tungsten carbide, zinc oxide, and a combination thereof.

3. The method of claim 1, where ingredient (E) has an average, per molecule, of at least one group of formula where R represents a hydrogen atom or a monovalent organic group.

4. The method of claim 1, where ingredient (E) has a formula:

where X represents a cyclic hydrocarbon group, subscript x has a value ranging from 3 to 15, each $R^1$ is independently a branched or linear monovalent hydrocarbon group, and each R" is independently a branched or linear hydrocarbon atom or a monovalent organic group.

5. The method of claim 1, where ingredient (E) is selected from the group consisting of bis(2-ethylhexyl) terephthalate; bis(2-ethylhexyl)-1,4-benzenedicarboxylate; 2-ethylhexyl methyl-1,4-benzenedicarboxylate; 1,2cyclohexanedicarboxylic acid, dinonyl ester, branched and linear; bis(2-propylheptyl) phthalate or di-(2-propyl heptyl) phthalate; diisononyl adipate; trioctyl trimellitate; triethylene glycol bis (2-ethylhexanoate); diethylene glycol dibenzoate; 1,1,3-tris (2-methyl-4-hydroxy-5-tert-butylphenyl)butane; di(2-ethylhexyl) phthalate; bis(2-ethylhexyl) adipate; dimethyl phthalate; diethyl phthalate; dibutyl phthalate; di-2-ethylhexyladipate; 1,2, 4-benzenetricarboxylic acid, tris(2-ethylhexyl) ester; trioctyl trimellitate; triethylene glycol bis(2-ethylhexanoate); bis(2-ethylhexyl) terephthalate; diethylene glycol dibenzoate; 1,1,3-tris(2-methyl-4-hydroxy-5-tert-butylphenyl)butane; 1,2,3-triacetoxypropane; a fatty acid ester; and a combination thereof.

6. The method of claim 1, further comprising: an additional ingredient selected from (F) a spacer, (G) a reinforcing or extending filler, (H) filler treating agent, (I) an adhesion promoter, (J) a vehicle, (K) a surfactant, (L) a flux agent, (M) an acid acceptor, (N) a stabilizer, and a combination thereof.

7. The method of claim 1, further comprising: applying the composition to a support before step 1).

8. The method of claim 1, where the heat source comprises an (opto)electronic component.

9. The method of claim 1, where the heat dissipator comprises a heat sink, a thermally conductive plate, a thermally conductive cover, a fan, or a circulating coolant system.

10. An interface material comprising:
0) a support, and
I) a cured silicone prepared by curing a composition comprising:
  (A) a polyorganosiloxane base polymer having an average per molecule of at least two aliphatically unsaturated organic groups,
  optionally (B) a crosslinker having an average per molecule of at least two silicon bonded hydrogen atoms,
  (C) a catalyst selected from hydrosilylation reaction catalyst and peroxide cure catalysts,
  (D) a thermally conductive filler, and
  (E) an organic plasticizer soluble in ingredient (A), which does not inhibit curing of the composition, where the composition is coated on two sides of the support; and where the cured silicone is formed as a flat member, a
hemispherical nubbin, a convex member, a pyramid, or a cone.

11. The interface material of claim 10, where the support comprises a carbon fiber mesh, a metal foil, a perforated metal foil, a filled or unfilled plastic film, or a woven or nonwoven substrate.

12. The interface material of claim 10, further comprising II) a release sheet covering a surface of the cured silicone opposite the support.

13. A device comprising:
  a) a heat source,
  b) the interface material of claim 10, and
  c) a heat dissipator;
where the thermal interface material is positioned between the heat source and the heat dissipator along a thermal path extending from a surface of the heat source to a surface of the heat dissipator.

14. The device of claim 13, where the heat source is an (opto)electronic component.

15. Use of the interface material of claim 10, in an application selected from the group consisting of TIM1, TIM2, or both.

* * * * *